United States Patent [19]

Akahane et al.

[11] 4,148,184
[45] Apr. 10, 1979

[54] ELECTRONIC TIMEPIECE UTILIZING MAIN OSCILLATOR CIRCUIT AND SECONDARY OSCILLATOR CIRCUIT

[75] Inventors: Yoshikazu Akahane; Shinji Morozumi, both of Suwa, Japan

[73] Assignee: Kabushiki Kaisha Suwa Seikosha, Tokyo, Japan

[21] Appl. No.: 817,776

[22] Filed: Jul. 21, 1977

[30] Foreign Application Priority Data

Jul. 21, 1976 [JP] Japan ................................ 51/86751

[51] Int. Cl.$^2$ .............................................. G04C 3/00
[52] U.S. Cl. .................................. 58/23 AC; 331/1 R; 331/2
[58] Field of Search .......................... 331/1 R, 2, 16, 18; 58/23 A, 23 AC, 23 R, 28 R

[56] References Cited

U.S. PATENT DOCUMENTS

| | | | |
|---|---|---|---|
| 3,530,663 | 9/1970 | Marti | 58/23 R |
| 3,609,579 | 9/1971 | Chappell et al. | 331/2 |
| 3,807,164 | 10/1972 | Zaisky et al. | 58/28 R |
| 3,938,316 | 2/1976 | Morokawa et al. | 58/23 A |
| 3,978,650 | 9/1976 | Hashimoto et al. | 58/23 AC |
| 4,068,462 | 1/1978 | Duff et al. | 58/23 AC |
| 4,092,604 | 5/1978 | Berney | 58/23 AC |

FOREIGN PATENT DOCUMENTS

2508915 9/1975 Fed. Rep. of Germany .......... 58/23 R

*Primary Examiner*—Robert K. Schaefer
*Assistant Examiner*—Forester W. Isen

*Attorney, Agent, or Firm*—Blum, Moscovitz, Friedman & Kaplan

[57] ABSTRACT

An electronic timepiece having a main oscillator circuit including a first quartz crystal vibrator as a time standard and also having a secondary oscillator circuit including a further quartz crystal vibrator as a time standard for reducing the affect of temperature on the accuracy of the timepiece by utilizing the different temperature characteristics of the respective time standards is provided. The main oscillator circuit produces a high frequency time standard signal having a first frequency rate that is determined, at least in part, by the temperature characteristic of the first time standard, which characteristic includes an inflection peak at a specific temperature. The second oscillator circuit produces a second high frequency time standard signal having a second predetermined frequency, determined, at least in part, by the temperature characteristic of the second time standard being distinct from that of the first time standard. Phase detection circuitry is provided for producing a phase detection signal in response to detecting a predetermined frequency difference in phase between the first and second high frequency time standard signals when the temperature is 10° higher or lower than the specific temperature at which the first time standard has its inflection peak. A display is provided for displaying actual time in response to receiving a low frequency time signal produced by divider circuitry. A frequency adjustment circuit is coupled intermediate the phase detection circuitry and the divider circuitry for adjusting the frequency of the low frequency time signal produced by the divider circuitry when a phase detection signal is applied thereto.

13 Claims, 5 Drawing Figures

ELECTRONIC TIMEPIECE UTILIZING MAIN OSCILLATOR CIRCUIT AND SECONDARY OSCILLATOR CIRCUIT

BACKGROUND OF THE INVENTION

This invention is directed to an electronic timepiece having a main oscillator circuit including a first time standard and a second oscillator circuit including a second time standard, the respective time standards of said main and secondary oscillator circuits having different temperature characteristics, and, in particular, to an electronic timepiece for measuring a phase difference in the high frequency time standard signals produced by respective first and second oscillator circuits as a result of temperature being varied by more than 10° from the specific temperature at which the time standard of the main oscillator circuit admits of its inflection peak to thereby utilize the phase difference to adjust the frequency rate of the timekeeping circuitry.

A problem that inures to electronic timepieces utilizing piezoelectric vibrators as a time standard is the variation in the frequency rate of the vibrator caused by the temperature characteristics thereof. Although attempts have been made to utilize capacitors, having a temperature characteristic similar to that of the piezoelectric vibrator in the oscillator circuitry, at best, such temperature compensating capacitors can only approximate the temperature characteristics of the quartz crystal vibrator and, hence, cannot completely compensate therefor. Although piezoelectric vibrators, capable of operating at very high frequencies with little response to changes in temperature, have been provided, the high frequency of vibration (mega-Hertz range) has been found to be less than completely satisfactory in electronic timepieces. Specifically, piezoelectric vibrators, capable of operating in the mega-Hertz range are extremely large, thereby rendering it difficult to miniaturize the electronic timepiece. Secondly, by providing a time standard in the mega-Hertz range, the timekeeping circuitry is required to operate at higher switching speeds, thereby consuming an excess of power, and, hence, shortening the life of the battery utilized to power the electronic wristwatch. Accordingly, a small-sized electronic wristwatch that utilizes the temperature characteristics of first and second piezoelectric vibrator time standards to reduce variations in the timing rate caused by changes in temperature is desired.

SUMMARY OF THE INVENTION

Generally speaking, in accordance with the instant invention, an electronic timepiece having a main oscillator circuit, including a first time standard and a second oscillator circuit, having a second time standard, is provided. The main oscillator circuitry is adapted to produce a first high frequency time standard signal having a first predetermined frequency rate determined, at least in part, by the temperature characteristic of the first time standard, which temperature characteristic includes an inflection peak at a specific temperature. A secondary oscillator circuit is adapted to produce a second high frequency time standard signal having a second predetermined frequency determined, at least in part, by the temperature characteristic of the second time standard, the temperature characteristic of said second time standard being distinct from the temperature characteristic of said first time standard. Phase detection circuitry is provided for producing a phase detection signal in response to detecting a predetermined difference in phase between the first and second high frequency time standard signals when the temperature is either 10° higher or lower than the specific temperature at which the first time standard has its inflection peak. A divider circuit is adapted to produce a low frequency time standard signal and a display is coupled to the divider circuit for displaying actual time in response to the low frequency time signal being applied thereto. Frequency adjustment circuitry is coupled intermediate the phase detection circuitry and the divider circuitry for adjusting the frequency of the low frequency time signal produced by the divider means when the phase detection signal is applied thereto.

Accordingly, it is an object of the instant invention to provide an improved, highly accurate, small-sized electronic wristwatch.

A further object of the instant invention is to provide a highly accurate electronic timepiece wherein variations in the timing rate of the timekeeping circuitry are reduced by including an additional piezoelectric vibrator time standard.

Another object of the instant invention is to provide an accurate electronic timepiece formed of first and second piezoelectric vibrator time standards that vary in accordance with changes in temperature and have inflection points that occur at different temperatures.

Still a further object of the instant invention is to provide an electronic timepiece having a main vibrator and a secondary vibrator and phase detection circuitry for determining a predetermined difference in the phase between the signals produced as a result of the distinct temperature characteristics of the main vibrator and the secondary vibrator when the temperature is 10° higher or lower than the specific temperature at which the main vibrator has its inflection peak.

And, still a further object of the instant invention is to provide an electronic timepiece having a main vibrator and a secondary vibrator having distinct inflection peaks wherein the range of the temperature coefficients of the respective vibrators is in the range of $-2.0 \times 10^{-8}/°C.^2$ to $-4.5 \times 10^{-8}/°C.^2$.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
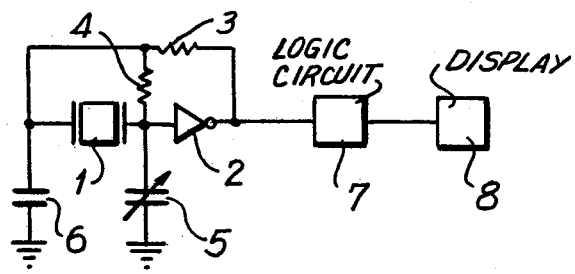
FIG. 1 is a circuit diagram of an electronic timepiece having a piezoelectric vibrator time standard, constructed in accordance with the prior art.

Reference is first made to FIG. 1, wherein an electronic timepiece, constructed in accordance with the prior art, is depicted. The electronic timepiece includes an oscillator circuit having a piezoeiectric vibration 1 as a time standard for permitting the oscillator circuit to produce a high frequency time standard signal. A divider circuit 7 is coupled to the oscillator circuit for dividing down the high frequency time standard signal produced thereby and producing a low frequency time signal. The divider circuitry is usually comprised of a plurality of series-connected divider stages, which divider stages produce a low frequency time signal having a period, such as one second or one minute, that is representative of actual time. A display 8 is coupled to the divider circuit 7 and, in response to receiving the low frequency time signal produced by the divider circuit, displays actual time. The display 8 can either be a digital display, formed from seven-segmented liquid crystal or light emitting diode display digits or, alternatively, the display can be an analog display having clock hands for displaying actual time in response to the low frequency time signal being applied thereto.

The oscillator circuit includes a C-MOS inverter having a gate input terminal coupled to ground through a variable tuning capacitor 5. The gate output terminal of the C-MOS inverter is coupled through a phase control resistor 3 to a biasing feedback resistor 4 coupled in parallel with the piezoelectric vibrator 1. Also coupled to the phase control resistor 3 and parallel coupled feedback resistor 4 and piezoelectric vibrator 1 is a capacitor 6, which capacitor is utilized to stabilize the frequency of the high frequency time standard signal produced by the oscillator circuitry. The frequency of the high frequency time standard signal is tuned by variable capacitor 5.

Because piezoelectric vibrators have temperature characteristics that cause a variation in their frequency of vibration, in response to a change in temperature, capacitors having temperature characteristics that approximate the temperature characteristics of the piezoelectric vibrator, have been utilized to compensate for changes in the frequency of vibration of the vibrator caused by its temperature characteristic. It is noted however that capacitors having temperature characteristics that approximate that of the piezoelectric vibrator time standard are not, even in the best case, sufficiently similar to that of the quartz crystal vibrator to guarantee the changes in temperature will not adversely affect the frequency of the high frequency time standard signal produced by the oscillator circuitry. Moreover, if temperature compensation means are not provided, the low frequency time signal produced by the divider circuitry, will be less accurate and, hence, reduce the overall accuracy of the timepiece.

Although piezoelectric vibrators having a highly accurate temperature characteristic have been provided, these piezoelectric vibrators vibrate at frequencies in the mega-Hertz range and, hence, have been found to be less than completely satisfactory for two reasons. First, the mega-Hertz range increases the power consumption of the timekeeping circuitry and thereby shortens the life of the battery utilized to energize the electronic timepiece circuitry. Secondly, such mega-Hertz piezoelectric vibrators are larger in size and thereby require considerable space, thereby preventing the oscillator assembly from being sufficiently miniaturized to permit same to be utilized in an electronic wristwatch. Accordingly, the instant invention is characterized by the use of first and second piezoelectric vibrators in the same electronic timepiece and, in particular, the use of the respective temperature characteristics thereof to reduce the effect of changes in temperature on the accuracy of an electronic timepiece utilizing such piezoelectric vibrators.

Figure 2:
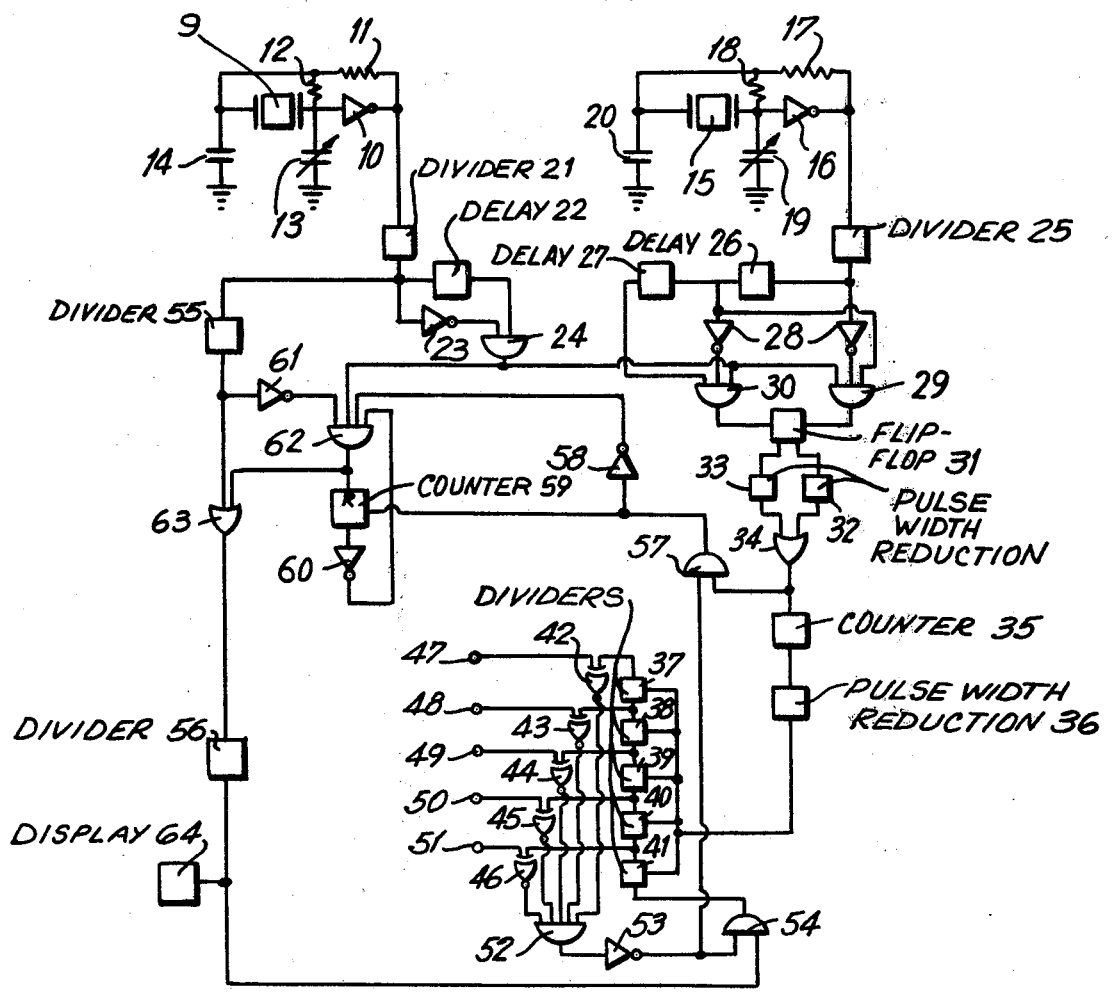
FIG. 2 is a circuit diagram of a programmable memory and frequency adjustment circuit for advancing the frequency rate of an electronic timepiece having a main oscillator circuit and secondary oscillator circuit constructed in accordance with a preferred embodiment of the instant invention.

Reference is now made to FIG. 2, wherein an electronic timepiece, including a main oscillator and a secondary oscillator constructed in accordance with the instant invention, is depicted. The main oscillator includes a piezoelectric vibrator 9, inverter 10, phase control resistor 11, feedback resistor 12, temperature compensating capacitor 14 and tuning capacitor 13. The secondary oscillator circuit includes a second piezoelectric vibrator 15, bias resistor 18, feedback resistor 17, inverter 16 and tuning capacitor 19, which elements are identical with and operate in the same manner as the elements of the main oscillator circuit. Moreover, each of the elements in the main oscillator circuit and secondary oscillator circuit are identical in structure and operation to their counterpart elements, described in detail above with respect to the prior art embodiment depicted in FIG. 1.

The high frequency time standard signal, produced by the main oscillator circuit, is applied to divider 21 and is divided down and applied to delay 22, inverter 23 and divider 55. Delay 22 is a shift register and, in combination with inverter 23 and AND gate 24 provides an output signal at the output of AND gate 24 that has the same frequency as the output of the divider 21 with a substantially reduced pulse width (duty cycle). Similarly, the second high frequency time standard signal produced by the secondary oscillator circuit is applied to divider 25, which divider has the same number of divider stages as the divider 21. The divided down output signal of divider 25 is respectively applied as a first input to an AND gate 29, through an inverter 28 and, additionally, as in input to AND gate 30 through a delay 26 and inverter 28. Moreover, the output of delay 26 is applied to a further delay 27, which applies its output to a first input of AND gate 30. The output signal from AND gate 24 is applied as a third input to AND gate 30, and as a first input to AND gate 29. The outputs of AND gates 29 and 30 are respectively connected to a set input and reset input of a set-reset flip-flop circuit 31.

By this arrangement, it is assured that AND gate 29 will receive a coincident HIGH binary level input only when the second high frequency time standard signal, produced by divider 25, is out of phase by a predetermined amount, such as a full half cycle with the divided down high frequency signal produced by divider 21. When this condition exists, a HIGH level pulse signal is applied to the set terminal S of the set-reset flip-flop 31 by the AND gate 29 to thereby apply a HIGH binary level signal to a further pulse width reduction circuit 32 formed in the same manner as the pulse width reduction circuit including delay 22, inverter 23 and AND gate 34, discussed above. Moreover, thereafter a reduced pulse width reset pulse is produced at the output of AND gate 30 and is applied to the Reset terminal R of the set-reset flip-flop 31 to thereby reset same and, hence, apply a HIGH binary level signal to a further pulse width reduction circuit 33 of the type detailed above.

Accordingly, as noted above, the outputs of AND gates 29 and 30 are respectively connected to the set input and reset input of the set-reset flip-flop 31, which flip-flop circuit is operated in response to the signals produced by the respective main and secondary oscillator being one-half cycle out of phase with respect to each other. The output signal from flip-flop 31 is applied to the respective inputs of pulse width reduction circuits 33 and 32 so that a signal having a shortened duty cycle and representative of each change of state of the set-reset flip-flop 31 is applied through OR gate 34.

Accordingly, a phase difference signal is applied by OR gate 34 to a counter 35 and to a second input of an AND gate 57. When counter 35 is counted through a full scale, a reset pulse is applied through a further pulse width reduction circuit 36 to a timer circuit comprised of series-connected dividers 37 through 41. The pulse width reduction circuit 36 is identical to the pulse width reduction circuits detailed above and is provided to assure that the reset pulse, applied to the reset terminal of the dividers 37 through 41, is a pulse having a shortened duty cycle. It is noted that the respective counts of each of the dividers 37 through 41, of the timer circuit, is compared with a preset count of each of the programming terminals 47 through 51 that define respective inputs to a comparator circuit comprised of EXCLUSIVE NOR gates 42 through 46. A first input of each of the EXCLUSIVE NOR gates 42 through 46 includes programming terminals 47 through 51, respectively. The other input of each of the EXCLUSIVE NOR gates is the respective outputs of the dividers 37 through 41. Therefore, when each of the EXCLUSIVE NOR gates 42 through 46 detect that the count of the dividers 37 through 41 are coincident with the count 47 through 51 of the programming terminals, a HIGH binary level input is applied to each of the inputs of the AND gate 52. A high level output is produced by AND gate 52 when a coincidence between the set count of each of the programming terminals 47 through 51 and the dividers 37 through 41 is detected.

When a reset pulse, produced by counter 35, is applied to each of the dividers 37 through 41 of the timer, the EXCLUSIVE NOR gate comparators detect the absence of a coincidence in the count of the dividers and preset count of the programmable terminals and produce a LOW binary level signal at the output of AND gate 52. The LOW level binary signal produced at the output of AND gate 52 is, in turn, applied through inverter 53 wherein same is inverted and applied to the first input of an AND gate 54 as a HIGH binary level input. As is illustrated in FIG. 2, when the first input to AND gate 54 is a HIGH level signal, a low frequency time signal, produced by divider 56, is applied through the other input of the AND gate 54 to the series-connected dividers 37 through 41 to effect a counting thereby. Accordingly, the high frequency time standard signal produced by the main oscillator and divided down by divider 21, divider 55 and divider 56 is applied to the display 64 as a low frequency time signal, and is also applied through AND gate 54 to the timer comprised of dividers 37 through 41. Although FIG. 2 illustrates the low frequency time signal produced by the divider 56 being applied through AND gate 54 to the timer, an intermediate frequency signal, taken from one of the divider stages in the divider 56, can be utilized as the signal for controlling the timer, and need not be limited to the low frequency time signal, illustrated in FIG. 2.

By applying the low frequency time signal to the dividers 37 through 41, when each of the dividers 37 through 41 are referenced to the same count as the programmable terminals 47 through 51, and hence are coincident with respect thereto, a HIGH level output is produced by AND gate 52, which HIGH level signal is inverted by inverter 53 and applied as an inhibit signal at the first input of AND gate 54 to thereby inhibit the application of the low frequency time signal produced by divider 56 to the dividers 37 through 41. Accordingly, once the AND gate 54 prevents or inhibits the low frequency time signal from being applied to dividers 37 through 41, the count thereof remains clamped until a reset pulse is once again applied to the reset terminal of the dividers 37 through 41 to begin a further timing cycle. The output signal produced by the pulse width reduction circuit 36 is, therefore, utilized as a trigger signal for the timer circuitry comprised of dividers 37 through 41. It is noted that the programmable terminals 47 through 51 can be set to a programmed count by any suitable manner in order to define the coincidence count of the comparator circuitry comprised of the EXCLUSIVE NOR gates 42 through 46.

As set forth in detail above, when the output of AND gate 52 is referenced to a LOW binary level, the inverter 53 applies a HIGH binary state input to the AND gate 54 to permit the low frequency time signal to be applied therethrough. At the same time, the output of the inverter 53 is applied to a first input of AND gate 57, which AND gate receives as its other input the output of OR gate 34, and in response to detecting a coincident HIGH binary state of both inputs, applies a reset signal to the counter 59. When the counter 59 is reset to a count of zero, inverter 60 references a fourth input of AND gate 62 to a HIGH binary state. Thereafter, when AND gate 57 no longer applies a HIGH binary state signal to the reset terminal of counter 59, inverter 58 insures that a third input of AND gate 62 is referenced to a HIGH binary state. A second input of AND gate 62 is the output of AND gate 24, which AND gate, as aforenoted, is the output signal of the divider 21 with a reduced duty cycle. Additionally, the divided down time frequency signal produced by divider 21, in response to the high frequency time standard signal produced by the main oscillator, is applied to divider 55, which divider divides same down and applies a further divided down intermediate frequency signal to OR gate 63. Thus, when the intermediate frequency signal, produced by divider 55, is at a LOW binary level and each of the second, third and fourth inputs of the AND gate 62 are HIGH binary level signals, inverter 61 applies a HIGH binary level signal to the first input of the AND gate 62 to thereby apply a HIGH binary level signal of a short duration to the OR gate 63 to thereby add a pulse to the intermediate frequency signal produced by divider 55 and, hence, increase the timing rate thereof. Accordingly, inverter 61, AND gate 62, inverter 58 and counter 59 assure that whenever each of the four inputs of AND gate 62 are coincident, and produce a HIGH binary state signal, the intermediate frequency signal applied to the second input of OR gate 63 is of opposite phase to the intermediate frequency signal from the divider 55 and further assure that a pulse is added to the pulse rate thereof. Moreover, the pulse rate of the divided down signal, produced by divider 55, is increased before same is applied to divider 56, thereby assuring that the low frequency time signal, applied to the display 64 by divider 56, is adjusted. Once the counter 59 beings to count, the output of the inverter 60 is a LOW output and thereby prevents any further pulses from being added until the next time that the AND gate 57 has applied thereto a phase detection pulse during the operation of the timer.

Accordingly, as is illustrated in FIG. 2, the phase difference between the high frequency time standard signals, produced by the main oscillator circuit and the secondary oscillator circuit, as a result of differences caused, at least in part, by the temperature characteristics of the respective time standards, utilized in the main and secondary oscillator circuits, can produce an adjustment in the timing rate of the timepiece by utilizing a flip-flop (31) phase detecting circuit. It is noted however that if a predetermined difference between the timing rate of the high frequency time standard signal, produced by the main oscillator and the high frequency time signal produced by the secondary oscillator, does not occur within a specific duration of time, the addition of a pulse to the timing rate of the main oscillator would result in an adjustment of the timing rate that would render same less accurate rather than more accurate. This results from the fact that, under the stated circumstances, the effect of temperature on the oscillators is insufficient to affect the accuracy of the timepiece within the already established standard of accuracy of the timepiece. Accordingly, the preset count of the timer, comprised of dividers 37 through 41, defines an interval within which a phase difference signal, consisting of one or more pulses, must be applied to AND gate 57 to effect an adjustment of the timing rate of the low frequency time signal produced by the main oscillator circuitry. The time interval over which the timer permits adjustment of the timing rate, by reason of temperature variations, is selected by the programmable terminals 47 through 51, the setting of such terminals being more particularly described below.

Figure 3:
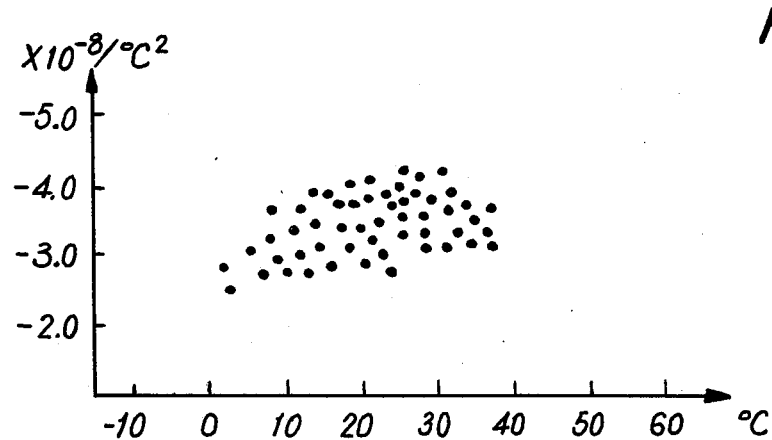
FIGS. 3 and 4 respectively illustrate the distinct temperature characteristics of a plurality of quartz crystal time standards manufactured at the same time, in the same manner.
Figure 4:
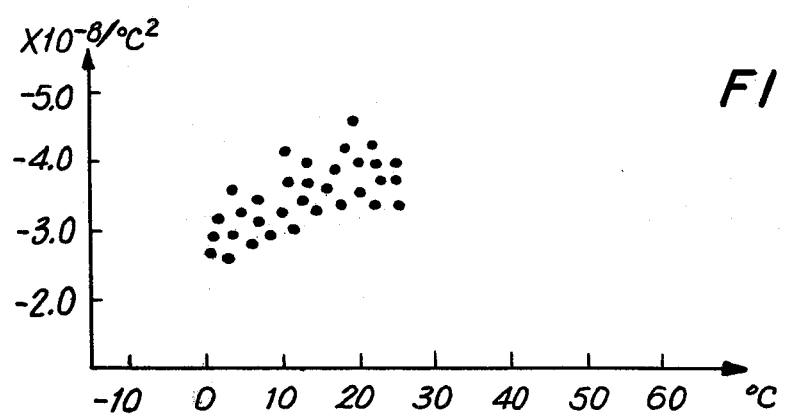

The piezoelectric vibrators utilized as the vibrators 9 and 15 can be flexural mode quartz crystal vibrators, capable of oscillating in a 1 KHz to 100 KHz range, or longitudinal vibration mode piezoelectric vibrators capable of vibrating in a range of 300 KHz to 1,000 KHz. Either type of vibrator will provide a small-sized oscillator assembly particularly suitable for use in a small-sized electronic timepiece such as a wristwatch. The frequency response of such piezoelectric vibrators are based on the temperature characteristic thereof, and are represented by a quadratic curve. Flexural mode vibrators have quadratic coefficients within the range of $-2.0 \times 10^{-8}/°C.^2$ to $-4.5 \times 10^{-8}/°C.^2$ and an inflection peak within a temperature range from $-50°$ C. to $+80°$ C. It is noted that, as utilized herein, the term inflection peak refers to the flection temperature characteristic point, otherwise known as the inflection point, wherein the quadratic curve changes its directional characteristic ($d^2X/dt^2=0$). Referring to FIGS. 3 and 4, examples of the different quadratic coefficients of quartz crystal vibrators over a variable temperature range are depicted at two different frequencies (FIG. 3 representing about 32 KHz). In FIGS. 3 and 4 the axis of abscissa represents the flection temperature and the axis of ordinate represents the quadratic temperature coefficient. The value of the inflection point, $T_{MAX}$ and the quadratic temperature coefficient A, were determined by substituting actually measured values of frequency at temperatures (T) of 4° C., 20° C. and 30° C. into the following equation, which equation represents the change in the rate of frequency ($\Delta f/f$):

$$\Delta f/f = A(T - T_{MAX})^2 + C$$

where A is the temperature coefficient, $T_{MAX}$ is the inflection point temperature and C is a dimensionless constant. It is noted that FIGS. 3 and 4 illustrate the inflection temperature as determined by utilizing the above-noted equation. However, if actual measurements are taken at enough frequencies, the same information can be obtained. If measured points are substituted into the formula and taken at intervals of at least 5° with respect to each other, when the frequency rate changes in accordance with the temperature characteristic, the values of the quadratic coefficient and inflection point are accurately and readily ascertained for all temperature ranges. As shown in FIGS. 3 and 4, the values for a large number of similar vibrators fall within a similar range so that the effectiveness of a preset accuracy compensating function is good.

Referring again to FIG. 2, and the phase detection and frequency adjustment circuitry contained therein, it is the average of the ration of the frequency with which the correction pulse is added by the OR gates 63 to the frequency of the intermediate frequency signal produced by the divider 55 which is controlled by the timer circuitry comprised of dividers 37 through 41. Said dividers are programmed by programmable terminals 47 through 51 to a value selected to be close to the quadratic coefficient A (which may be plus or minus) of the formula detailed above. If the average of the above-mentioned ratio is less than twice the value of the quadratic coefficient A, the temperature characteristics of the piezoelectric vibration in the main oscillator circuit can be accurately compensated for and, therefore, the timing rate of the signals produced by the main oscillator citcuit can be improved. It is noted that the frequency of the high frequency time standard signal produced by the secondary oscillator is controlled so that the output frequency of the phase detection circuitry, illustrated in FIG. 2, may be zero when the temperature is either 10° higher or lower than the inflection point of the piezoelectric vibrator of the main oscillator circuit. When so selected, if the temperature varies within a plus or minus 10° of the flection peak point of the piezoelectric vibrator, utilized in the main oscillator circuit, the time required for the timing rate of the signal produced by the secondary oscillator to become out of phase with the timing rate of the signal produced by the main oscillator circuitry, is of a sufficient duration that it will occur outside of the time interval determined by the timer and, hence, no phase detection signal will be applied by the phase detection circuitry to the phase adjustment circuitry to add a pulse thereby. Accordingly, the temperature compensation function obtained by (difference between the frequencies of the main and suboscillators)$^2 \times$(programmable count of the timer), is highly symmetric, thereby providing a highly accurate degree of compensation. Under these parameters, the frequency of the high frequency time standard signals, produced by the respective oscillator circuits, will equal each other at at least one temperature in a temperature range of 5° C. to 36° C. in which the timepiece is normally utilized. Moreover, if the above parameters are met, in the temperature range from 15° C. to 30° C., the absolute value of the ratio of the frequency of the respective vibrators minus 1 will be equal to or less than $1 - 5 \times 10^{-4}$.

It is noted that the instant invention requires that piezoelectric vibrators, of the same range, be utilized. Accordingly, vibrators formed at the same time by mass production techniques can be utilized, thereby reducing the cost of utilizing two piezoelectric vibrators in each timepiece. Moreover, the variation in the frequency of the vibrations of piezoelectric vibrators, of the type discussed herein, within a usual temperature range of 15° C. to 30° C. is from $10 \times 10^{-5}$ to $50 \times 10^{-5}$. This permits the instant invention to effect easy control of the accuracy of the timepiece by permitting the frequency of the secondary oscillator circuit to be set proximate to the frequency of the piezoelectric vibrator of the main oscillator circuit at the inflection temperature. Thus, by selecting a piezoelectric vibrator for the main oscillator circuit that has its inflection peak within a normal temperature range of 5° C. to 40° C., the timing rate can be adjusted by utilizing a main oscillator circuit and secondary oscillator circuit. Moreover, when temperature compensation capacitors, and the like, are not provided in the oscillator circuitry, the instant invention permits a more accurate timing rate to be established in view of the inflection point being an inherent characteristic of a piezoelectric vibrator.

Figure 5:
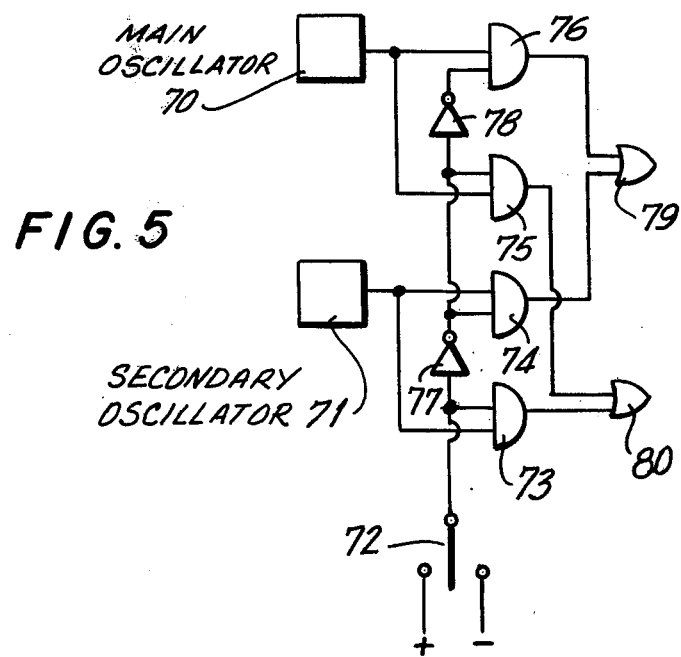
FIG. 5 is a circuit diagram of a control circuit for selectively reversing the high frequency time standard signals produced by the main oscillator circuit and secondary oscillator circuit in an electronic timepiece constructed in accordance with a further embodiment of the instant invention.

As detailed above, in order to permit the more accurate time standard to be utilized as the main time standard, a manually operated switching control circuit, of the type illustrated in FIG. 5, is provided. This circuit permits the respective high frequency time standard signals, produced by the main and secondary oscillator circuits, to be reversed and applied and detected to phase detection circuitry in a reversed manner. Specifically, the main oscillator circuit 70 produces a high frequency time standard signal, which signal is applied to a first input of AND gate 76 and a second input of AND gate 75. Similarly, a secondary oscillator circuit 71 applies a high frequency time standard signal to a first input of AND gate 74 and to the second input of AND gate 73. The outputs of AND gates 76 and 74 are respectively applied as first and second inputs to an OR circuit 79, whereas the outputs of AND gates 75 and 73 are respectively coupled as first and second inputs to an OR circuit 80. The outputs of OR circuits 79 and 80 are respectively applied to the dividers 21 and 25, illustrated in FIG. 2, in lieu of the high frequency time standard signals produced by the main and secondary oscillators, illustrated and described above, with respect to FIG. 2.

It is noted that a manually operated switch 72 is coupled to a first input of AND gate 73, through an inverter 77 to a second input of AND gate 74, and through the same inverter 77 to a first input of AND gate 75, and finally is further coupled through inverters 77 and 78 to a second input of AND gate 76.

Accordingly, when manually operated switch 72 is coupled to a negative (−) terminal, the high frequency time standard signal, produced by the secondary oscillator circuitry 71, is applied as a first input to OR circuit 79 and, additionally, the high frequency time standard signal, produced by the oscillator circuit 70, is applied to the OR circuit 80. Accordingly, the respective outputs of the OR circuits 79 and 80 are high frequency time standard signals respectively produced by secondary oscillator circuit 71 and the main oscillator circuit 70. However, when the manually operated switch is selectively positioned to a positive terminal (+), the OR circuits 79 and 80 respectively produce the high frequency time standard signal produced by the secondary oscillator circuit 71. Accordingly, the circuitry, depicted in FIG. 6, permits the signals produced by the respective oscillator circuit to be reversed in order to permit the more accurate signal to be utilized as the main oscillator signal.

Accordingly, the instant invention permits a more accurate adjustment of the timing rate of a timepiece in response to changes effected by the temperature characteristic of a quartz crystal vibrator. Moreover, this accuracy is obtained at low power consumption levels.

It will thus be seen that the objects set forth above, among those made apparent from the preceding description, are efficiently attained and, since certain changes may be made in the above construction without department from the spirit and scope of the invention, it is intended that all matter contained in the above description or shown in the accompanying drawings shall be ingerpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An electronic timepiece comprising in combination a main oscillator means including a first time standard having a first temperature characteristic, said oscillator means being adapted to produce a first high frequency time standard signal having a first predetermined frequency rate determined, at least in part, by the temperature characteristic of said first time standard, said first time standard having an inflection peak at a specific temperature, a second oscillator means including a second time standard having a second temperature characteristic that is distinct from the temperature characteristic of said first time standard, said second oscillator means being adapted to produce the second high frequency time standard signal having a second predetermined frequency determined, at least in part, by the temperature characteristic of said second time standard, phase detection means for producing a phase detection signal in response to detecting a predetermined difference in phase between said first high frequency time standard signal and said second high frequency time standard signal when the temperature is one of at least 10° higher or lower than the specific temperature at which the first time standard has its inflection peak, divider means for producing a low frequency time standard signal, display means for displaying actual time in response to said low frequency time signal applied thereto, and frequency adjustment means coupled intermediate said phase detection means and said divider means for adjusting the frequency of said low frequency time signal produced by said divider means in response to said phase detection signal being applied thereto.

2. An electronic timepiece as claimed in claim 1, wherein the absolute value of the ratio of the vibratory frequencies of said first and second high frequency time standards minus 1 equal to more than $5 \times 10^{-4}$, within a temperature range of 15° C. to 30° C.

3. An electronic timepiece as claimed in claim 1, wherein said first and second time standards are quartz crystal vibrators having a frequency of vibration between a temperature range of $-50°$ C. and $80°$ C. and wherein the respective quadratic coefficient of said first and second vibrators is in the range of $-2.0 \times 10^{-8}/°$ C.$^2$ to $-4.5 \times 10^{-8}/°$ C.$^2$.

4. An electronic timepiece as claimed in claim 1, wherein said vibrators have a vibratory frequency between 300 KHz and 1,000 KHz and an inflection point between $-50°$ C. and $80°$ C., said respective vibrators having a quadratic coefficient within the range of $-2.0 \times 10^{-8}/°$ C.$^2$ to $-4.8 \times 10^{-8}/°$ C.$^2$.

5. An electronic timepiece as claimed in claim 1, wherein the vibratory frequencies of both time standards are equal to each other, at least within a temperature range of $5°$ C. to $36°$ C.

6. An electronic timepiece as claimed in claim 5, wherein said time standards are characterized by having a temperature characteristic wherein the inflection peak of at least one of said time standards is in the range of $5°$ C. to $40°$ C.

7. An electronic timepiece as claimed in claim 1, wherein said phase detection means includes timer means for selecting a predetermined time interval, said predetermined time interval being at least equal to the time required for the predetermined difference in phase between said first high frequency time standard signal and said second high frequency time standard signal to occur when the temperature is more than $10°$ C. lower and/or higher than said specific temperature so that said phase detection means produces said phase detection signal when said predetermined difference in phase occurs during said predetermined time interval.

8. An electronic timepiece as claimed in claim 1, wherein said divider means is adapted to produce said low frequency time signal in response to a high frequency time standard signal applied thereto, and including manually operated inversion means adapted to be disposed in a first mode and a second mode, said manually operated inversion means being disposed intermediate said respective oscillator means and said divider means for applying said first high frequency time standard signal to said divider means in a first mode and for applying said second high frequency time standard signal to said divider means in a second mode.

9. An electronic timepiece comprising in combination a main oscillator means including a first time standard having a first temperature characteristic within a temperature range of $-50°$ C. to $80°$ C., said oscillator means being adapted to produce a first high frequency time standard signal having a first predetermined frequency rate determined, at least in part, by the temperature characteristic of said first time standard, said first time standard having a quadratic coefficient in the range of $-2.0 \times 10^{-8}/°$ C.$^2$ to $4.8 \times 10^{-8}/°$ C.$^2$, a second oscillator means including a second time standard having a second temperature characteristic with a temperature range of $-50°$ C. to $80°$ C. that is distinct from the temperature characteristic of said first time standard, said second oscillator means being adapted to produce the second high frequency time standard signal having a second predetermined frequency determined, at least in part, by the temperature characteristic of said second time standard, said second time standard also having a quadratic coefficient within the range of $-2.0 \times 10^{-8}/°$ C.$^2$ to $4.8 \times 10^{-8}/°$ C.$^2$, phase detection means for producing a phase detection signal in response to detecting a predetermined difference in phase between said first high frequency time standard signal and said second high frequency time standard signal, divider means for producing a low frequency time standard signal, display means for displaying actual time in response to said low frequency time signal applied thereto, and frequency adjustment means coupled intermediate said phase detection means for adjusting the frequency of said low frequency time signal produced by said divider means in response to said phase detection signal being applied thereto.

10. An electronic timepiece as claimed in claim 9, wherein the absolute value of the ratio of the vibratory frequencies of said first and second high frequency time standards minus 1 equals no more than $5 \times 10^{-4}$, within a range of $15°$ C. to $30°$ C.

11. An electronic timepiece as claimed in claim 9, wherein said vibrators have a vibratory frequency between 300 KHz and 1,000 KHz and an inflection point between $-50°$ C. and $80°$ C., said respective vibrators having a quadratic coefficient within the range of $-2.0 \times 10^{-8}/°$ C.$^2$ to $-4.8 \times 10^{-8}/°$ C.$^2$.

12. An electronic timepiece as claimed in claim 9, wherein the vibratory frequency of each time standard is equal to each other at least within a temperature range of $5°$ C. to $36°$ C.

13. An electronic timepiece as claimed in claim 9, wherein said time standards are characterized by having a temperature characteristic wherein the inflection peak of at least one of said time standards is in the range of $5°$ C. to $40°$ C.

* * * * *